United States Patent
Takobe

(10) Patent No.: US 12,463,645 B2
(45) Date of Patent: Nov. 4, 2025

(54) LEVEL SHIFTER, DRIVE CIRCUIT, SWITCHING POWER SUPPLY DEVICE, AND VEHICLE

(71) Applicant: ROHM CO., LTD., Kyoto (JP)

(72) Inventor: Isao Takobe, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 84 days.

(21) Appl. No.: 18/442,800

(22) Filed: Feb. 15, 2024

(65) Prior Publication Data

US 2024/0283455 A1    Aug. 22, 2024

(30) Foreign Application Priority Data

Feb. 20, 2023    (JP) .................. 2023-024227

(51) Int. Cl.
| | | |
|---|---|---|
| B60R 16/03 | (2006.01) | |
| H02M 1/08 | (2006.01) | |
| H02M 3/158 | (2006.01) | |
| H03K 19/0185 | (2006.01) | |

(52) U.S. Cl.
CPC ..... *H03K 19/018507* (2013.01); *B60R 16/03* (2013.01); *H02M 1/08* (2013.01); *H02M 3/158* (2013.01)

(58) Field of Classification Search
CPC ........ H03K 19/018507; H03K 19/0185; B60R 16/03; H02M 1/08; H02M 3/158
USPC ......................................................... 307/9.1
See application file for complete search history.

(56) References Cited

U.S. PATENT DOCUMENTS

2020/0162074 A1*  5/2020  Niikura ............ H03K 17/04123

FOREIGN PATENT DOCUMENTS

JP           2016067109           4/2016

* cited by examiner

*Primary Examiner* — Rexford N Barnie
*Assistant Examiner* — Xuan Ly
(74) *Attorney, Agent, or Firm* — Fish & Richardson P.C.

(57) ABSTRACT

A level shifter includes first to third signal generators, wherein the first and second signal generators use, as an upper-side power supply voltage, a first internal voltage based on a first voltage when the first voltage is higher than a second voltage, and a second internal voltage based on the second voltage when the second voltage is higher than the first voltage, wherein the third signal generator uses the second voltage as an upper-side power supply voltage, wherein the first signal generator uses, as a lower-side power supply voltage, a third internal voltage based on a third voltage when the third voltage is higher than a fourth voltage, and a fourth internal voltage based on the fourth voltage when the fourth voltage is higher than the third voltage, and wherein the third voltage is lower than the first voltage and the fourth voltage is lower than the second voltage.

7 Claims, 9 Drawing Sheets

LEVEL SHIFTER, DRIVE CIRCUIT, SWITCHING POWER SUPPLY DEVICE, AND VEHICLE

CROSS-REFERENCE TO RELATED APPLICATION

This application is based upon and claims the benefit of priority from Japanese Patent Application No. 2023-024227, filed on Feb. 20, 2023, the entire contents of which are incorporated herein by reference.

TECHNICAL FIELD

The present disclosure relates to a level shifter, a drive circuit, a switching power supply device, and a vehicle.

BACKGROUND

As a technique for realizing improvement in power density of a step-down switching power supply device, there is a switching power supply device that can realize a high step-down ratio even at high frequencies.

Further, as a solution to recent large power requirements in a switching power supply device, a method of using a GaN device as a switching element has emerged.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In this disclosure, a MOS (Metal Oxide Semiconductor) field effect transistor refers to a field effect transistor having a gate structure including at least three layers, i.e., a "layer made of a conductor or a semiconductor such as polysilicon having a low resistance value," an "insulating layer," and a "P-type, N-type, or intrinsic semiconductor layer." That is, the gate structure of the MOS field effect transistor is not limited to the three-layer structure of metal, oxide, and semiconductor.

<Switching Power Supply Device (Comparative Example)>

Figure 1:
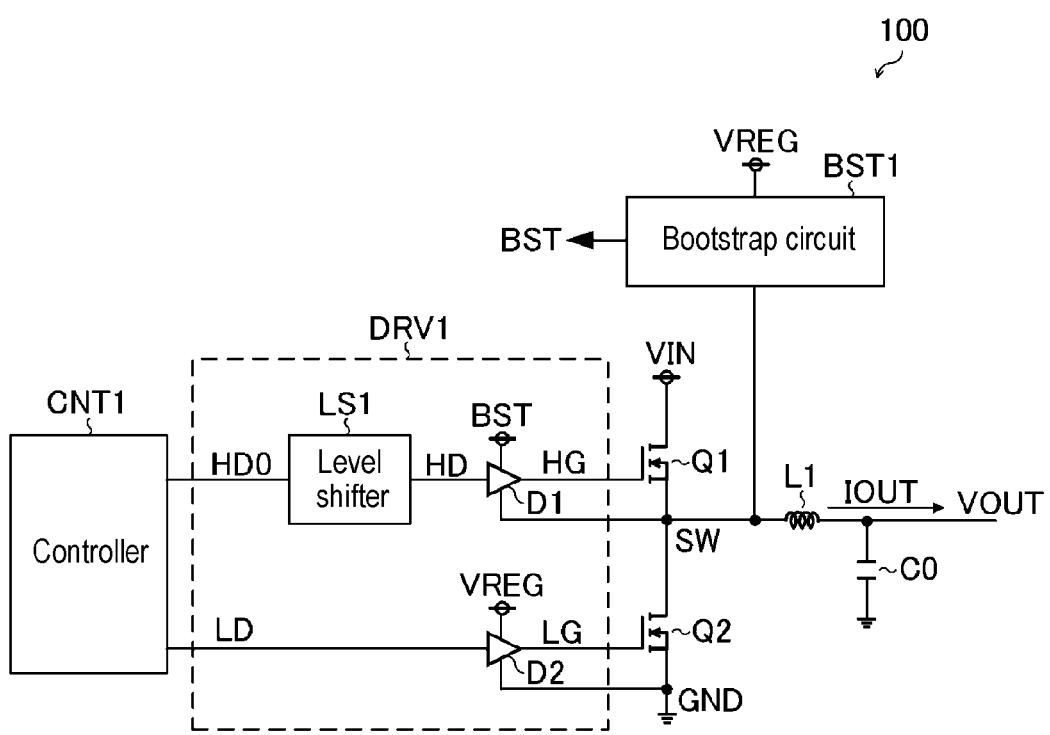
FIG. 1 is a view showing a switching power supply device according to a comparative example.

FIG. 1 is a view showing a switching power supply device according to a comparative example (a general configuration compared with an embodiment described later). A switching power supply device 100 of the comparative example includes a controller CNT1, a driver circuit DRV1, N-channel MOS field effect transistors Q1 and Q2, an inductor L1, an output capacitor C0, and a bootstrap circuit BST1. The driver circuit DRV1 is a circuit that includes a level shifter LS1 and drivers D1 and D2, and drives switching elements.

The N-channel MOS field effect transistors Q1 and Q2, which are switching elements, are connected in series. The N-channel MOS field effect transistors Q1 and Q2 are GaN devices. The N-channel MOS field effect transistor Q1 is a high-side switch provided on a higher potential side than the N-channel MOS field effect transistor Q2. The N-channel MOS field effect transistor Q2 is a low-side switch provided on a lower potential side than the N-channel MOS field effect transistor Q1.

The controller CNT1 outputs control signals HD0 and LD. Basically, when one of the control signals HD0 and LD is at a HIGH level, the other is at a LOW level. In addition, the controller CNT1 provides a dead time in which both the control signals HD0 and LD are at the LOW level.

The level shifter LS1 outputs a control signal HD obtained by level-shifting the control signal HD0. The driver D1 supplies a gate drive signal HG obtained by amplifying the control signal HD to a gate of the N-channel MOS field effect transistor Q1, thereby driving the N-channel MOS field effect transistor Q1. The driver D1 uses a bootstrap voltage BST as a positive-side power supply voltage and uses a switching voltage SW as a negative-side power supply voltage.

The driver D2 supplies a gate drive signal LG obtained by amplifying the control signal LD to a gate of the N-channel MOS field effect transistor Q2, thereby driving the N-channel MOS field effect transistor Q2. The driver D2 uses a constant voltage VREG (<an input voltage VIN) as a positive-side power supply voltage and uses a ground voltage GND (=0 V) as a negative-side power supply voltage. The constant voltage VREG is higher than the ground voltage GND.

The input voltage VIN is applied to a drain of the N-channel MOS field effect transistor Q1. The ground voltage GND is applied to a source of the N-channel MOS field effect transistor Q2. By switching the N-channel MOS field effect transistors Q1 and Q2, the switching voltage SW is generated at a connection node between the N-channel MOS field effect transistors Q1 and Q2.

The inductor L1 and the output capacitor C0 smooth the switching voltage SW to generate an output voltage VOUT.

The bootstrap circuit BST1 uses the constant voltage VREG and the switching voltage SW to generate the bootstrap voltage BST, which is higher than the input voltage VIN and the switching voltage SW.

Figure 2:
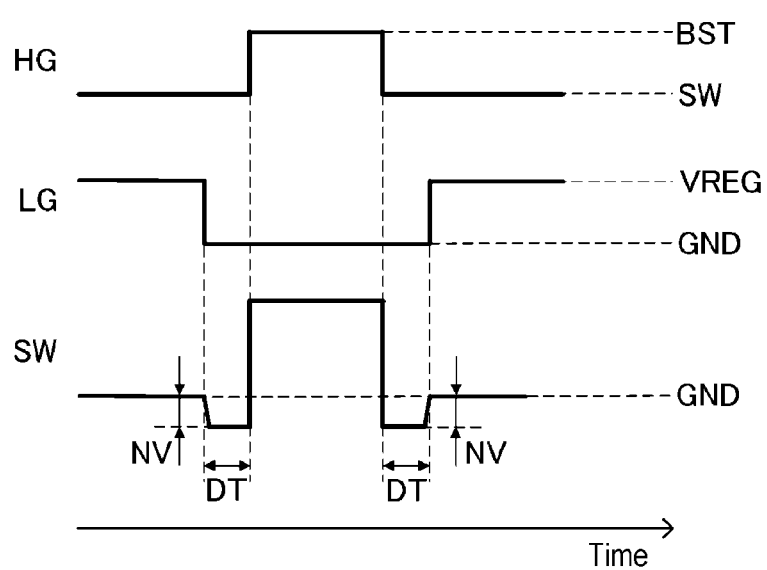
FIG. 2 is a timing chart showing voltages at various parts of the switching power supply device shown in FIG. 1.

FIG. 2 is a timing chart showing voltages at various parts of the switching power supply device 100. In FIG. 2, the gate drive signal HG, the gate drive signal LG, and the switching voltage SW are depicted in order from the top. During a dead time DT in which both the gate drive signals HG and LG are at the LOW level, the switching voltage SW drops to a negative side due to a current flowing through the inductor L1.

Assuming that the N-channel MOS field-effect transistor Q2 is a Si device, a drop amount NV of the switching voltage SW to the negative side during the dead time DT is about 0.7 V, which is a forward voltage of a body diode of the N-channel MOS field effect transistor Q2.

When the N-channel MOS field effect transistor Q2 is a GaN device, although there is no body diode in the N-channel MOS field effect transistor Q2, a channel is formed when the gate voltage becomes higher than the drain voltage and a difference between the gate voltage and the drain voltage exceeds a threshold voltage. Therefore, the drop amount NV of the switching voltage SW to the negative side during the dead time DT becomes about 2.5 V, which is the threshold voltage of the N-channel MOS field effect transistor Q2 as a GaN device.

That is, in the switching power supply device 100, since the N-channel MOS field effect transistors Q1 and Q2 are GaN devices, the drop amount NV of the switching voltage SW to the negative side during the dead time DT becomes large.

Figure 3:
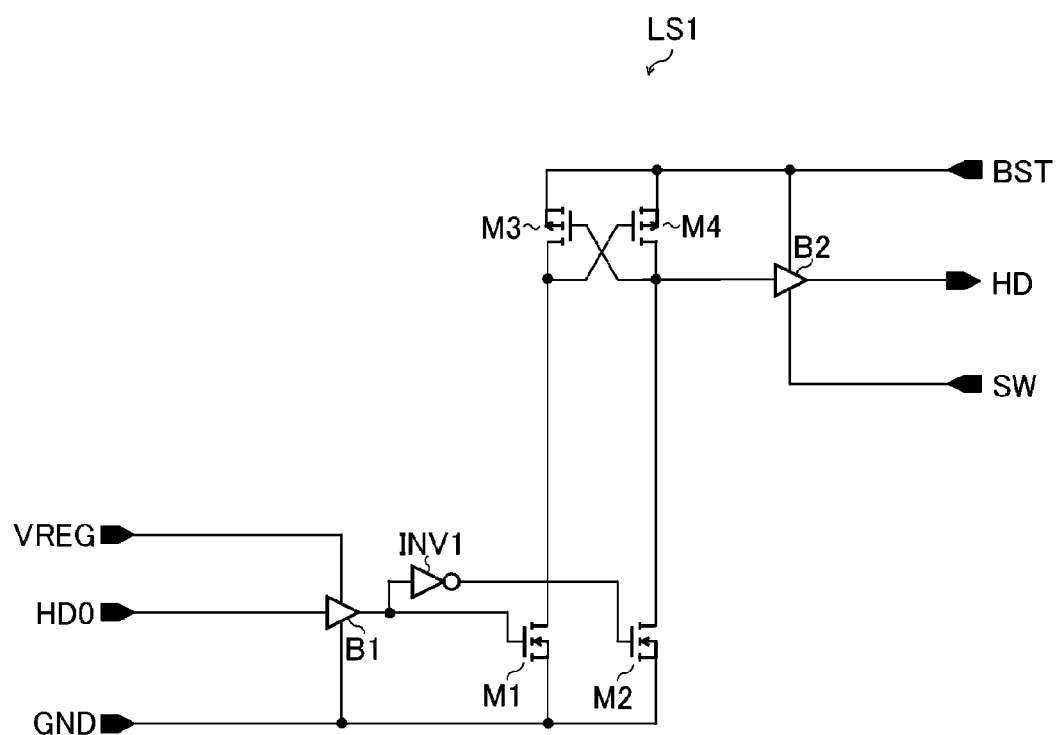
FIG. 3 is a view illustrating a configuration example of a level shifter according to the comparative example.

FIG. 3 is a view showing a configuration example of the level shifter LS1 according to the comparative example. The level shifter LS1 of the configuration example shown in FIG. 3 includes a buffer B1, an inverter INV1, N-channel MOS field effect transistors M1 and M2, P-channel MOS field effect transistors M3 and M4, and a buffer B2.

Figure 4:
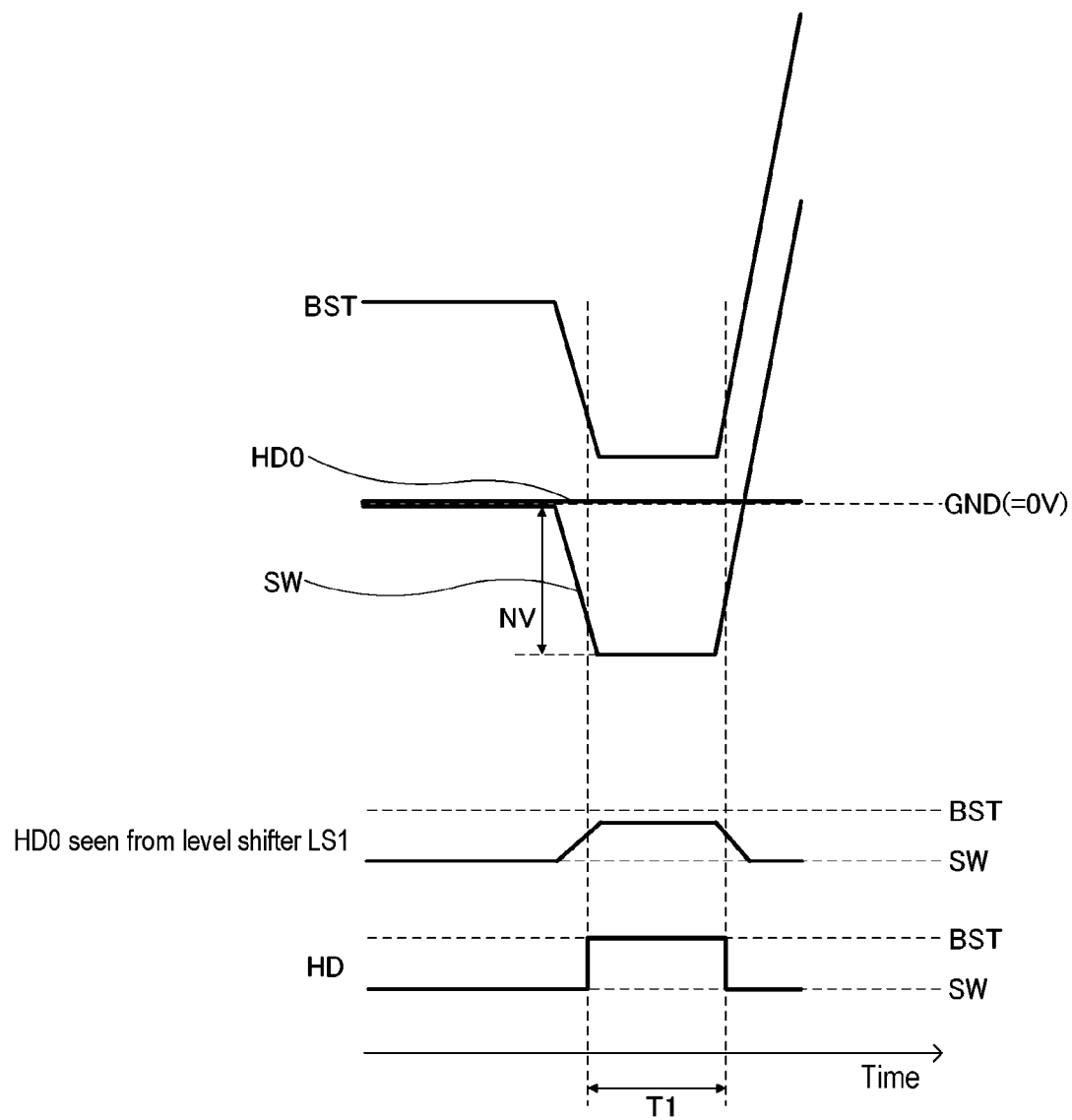
FIG. 4 is a timing chart showing voltages at various parts of the level shifter shown in FIG. 3.

FIG. 4 is a timing chart showing voltages at various parts of the level shifter shown in FIG. 3. FIG. 4 is a timing chart showing a section where a period in which the switching voltage SW is maintained at 0 V transitions to a period in which the switching voltage SW rises via the dead time. In FIG. 4, the bootstrap voltage BST, the control signal HD0, the switching voltage SW, the control signal HD0 seen from the level shifter LS1, and the control signal HD are depicted in order from the top.

The control signal HD0 is an input signal of the level shifter LS1. A waveform of the control signal HD0 seen from the level shifter LS1 is a signal waveform when viewed on the basis of the switching voltage SW, which is a negative side power supply voltage of the level shifter LS1. The control signal HD is an output signal of the level shifter LS1.

As the switching voltage SW drops significantly to the negative side, a period T1 appears in which the control signal HD0, which is 0 V, is closer to the bootstrap voltage BST than the switching voltage SW. During the period T1, the level shifter LS1 regards the control signal HD0, which is 0 V, as an input signal of a HIGH level, and erroneously operates to set the control signal HD to be an output signal of a HIGH level.

In view of the above considerations, hereinafter, an embodiment capable of preventing an erroneous operation of a level shifter will be provided.

<Switching Power Supply Device (Embodiment)>

Figure 5:
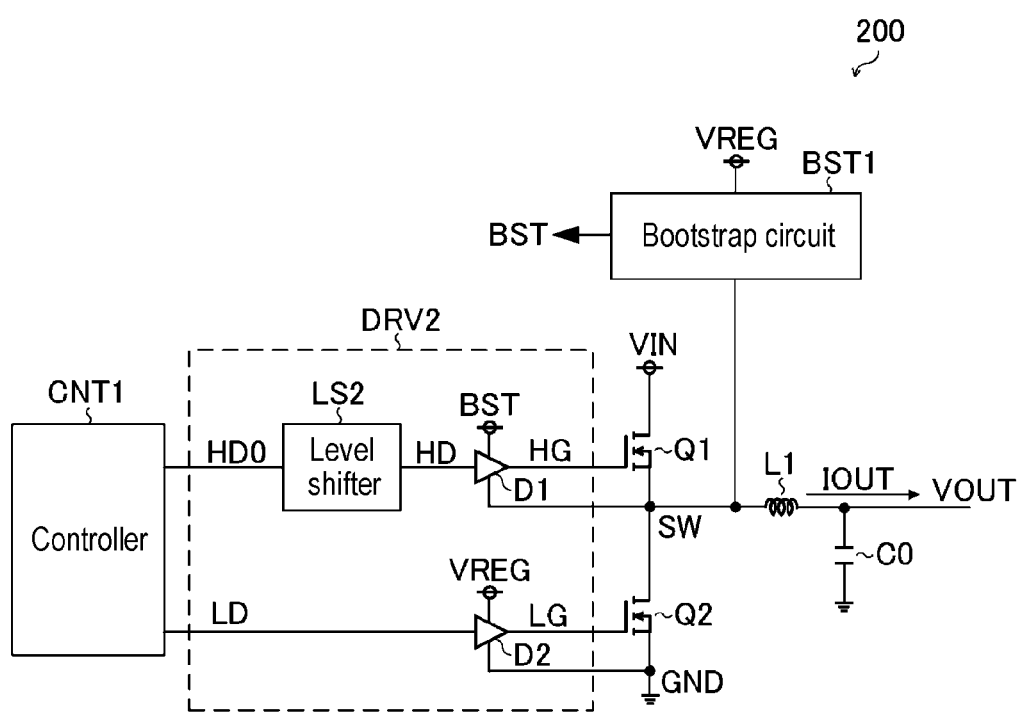
FIG. 5 is a view showing a switching power supply device according to an embodiment.

FIG. 5 is a view showing a switching power supply device according to an embodiment. A switching power supply device 200 of the present embodiment differs from the switching power supply device 100 described above in that the switching power supply device 200 includes a driver circuit DRV2 instead of the driver circuit DRV1, and is basically the same as the switching power supply device 100 described above in other respects. The driver circuit DRV2 is a circuit that includes a level shifter LS2 and drivers D1 and D2, and drives switching elements.

Figure 6:
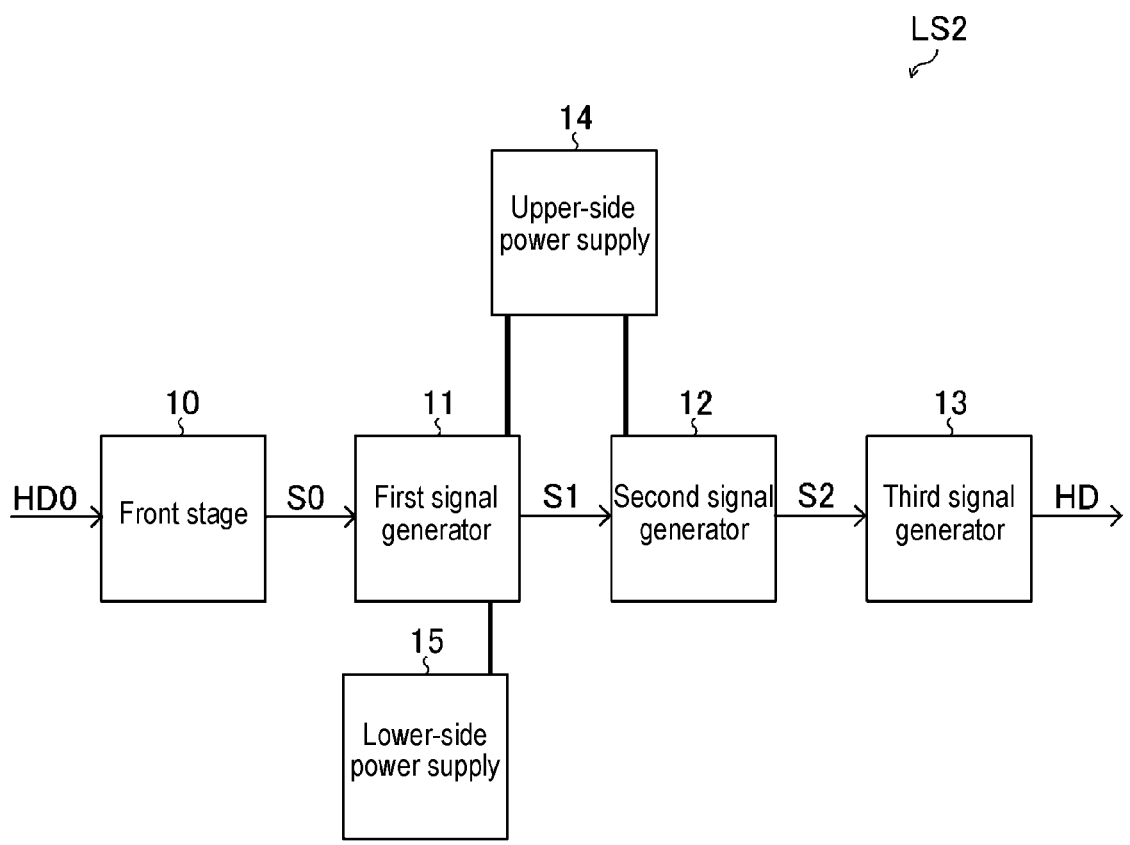
FIG. 6 is a view illustrating a schematic configuration example of a level shifter according to an embodiment.

FIG. 6 is a view showing a schematic configuration example of the level shifter LS2. The level shifter LS2, which is the schematic configuration example shown in FIG. 6, includes a front stage 10, a first signal generator 11, a second signal generator 12, and a third signal generator 13.

The front stage 10 generates an intermediate signal S0 obtained by up-shifting the control signal HD0, which is an input signal of the level shifter LS2.

The first signal generator 11 generates a first binary signal S1 in response to the intermediate signal S0. The intermediate signal S0 is a binary signal in response to the control signal HD0. Therefore, the first signal generator 11 generates the first binary signal S1 in response to the control signal HD0, which is the input signal of the level shifter LS2.

The second signal generator 12 generates a second binary signal S2 in response to the first binary signal S1.

The third signal generator 13 generates the control signal HD in response to the second binary signal S2. The control signal HD is a binary signal in response to the second binary signal S2.

The first signal generator 11 and the second signal generator 12 use a first internal voltage, which is based on the constant voltage VREG, as an upper-side power supply voltage when the constant voltage VREG is higher than the bootstrap voltage BST, and use a second internal voltage, which is based on the bootstrap voltage BST, as the upper-side power supply voltage when the bootstrap voltage BST is higher than the constant voltage VREG. The first internal voltage is a voltage lower than the constant voltage VREG by a first predetermined value. The second internal voltage is a voltage lower than the bootstrap voltage BST by a second predetermined value.

The third signal generator 13 uses the bootstrap voltage BST as an upper-side power supply voltage.

The first signal generator 11 uses a third internal voltage, which is based on the ground voltage GND, as a lower-side power supply voltage when the ground voltage GND is higher than the switching voltage SW, and uses a fourth internal voltage, which is based on the switching voltage SW, as the lower-side power supply voltage when the switching voltage SW is higher than the ground voltage GND. The third internal voltage is a voltage lower than the ground voltage GND by a third predetermined value. The fourth internal voltage is a voltage lower than the switching voltage SW by a fourth predetermined value.

The second signal generator 12 and the third signal generator 13 use the switching voltage SW as a lower-side power supply voltage.

The upper-side power supply 14 generates the first internal voltage and the second internal voltage. The upper-side power supply 14 supplies the first internal voltage to the first signal generator 11 and the second signal generator 12 when the constant voltage VREG is higher than the bootstrap voltage BST, and supplies the second internal voltage to the first signal generator 11 and the second signal generator 12 when the bootstrap voltage BST is higher than the constant voltage VREG.

The lower-side power supply 15 generates the third internal voltage and the fourth internal voltage. The lower-side power supply 15 supplies the third internal voltage to the first signal generator 11 when the ground voltage GND is higher than the switching voltage SW, and supplies the fourth internal voltage to the first signal generator 11 when the switching voltage SW is higher than the ground voltage GND.

Since the first signal generator 11 uses the first internal voltage as the upper-side power supply voltage when the constant voltage VREG is higher than the bootstrap voltage BST, the first signal generator 11 can determine that the intermediate signal S0, which is 0 V, is at a LOW level. Therefore, it is possible to prevent the level shifter LS2 from regarding the control signal HD0, which is 0 V, as an input signal of a HIGH level and operating erroneously.

In addition, the intermediate signal S0 is converted into the control signal HD by the second signal generator 12 and the third signal generator 13. The control signal HD has the same value as the bootstrap voltage BST when the control signal HD is at a HIGH level, and has the same value as the switching voltage SW when the control signal HD is at a LOW level.

As described above, the first signal generator 11 uses the first internal voltage, which is based on the constant voltage VREG, as the upper-side power supply voltage when the constant voltage VREG is higher than the bootstrap voltage BST, and uses the second internal voltage, which is based on the bootstrap voltage BST, as the upper-side power supply voltage when the bootstrap voltage BST is higher than the constant voltage VREG. Further, the first signal generator 11 uses the third internal voltage, which is based on the ground voltage GND, as the lower-side power supply voltage when the ground voltage GND is higher than the switching voltage SW, and uses the fourth internal voltage, which is based on the switching voltage SW, as the lower-side power supply voltage when the switching voltage SW is higher than the ground voltage GND. Thus, a voltage difference between the upper-side power supply voltage and the lower-side power supply voltage of the first signal generator 11 can be reduced to a low level. Therefore, it is not necessary to provide a high breakdown voltage element in the first signal generator 11, and as a result, the level shifter LS2 can reduce a signal delay time caused by a high breakdown voltage element.

Figure 7:
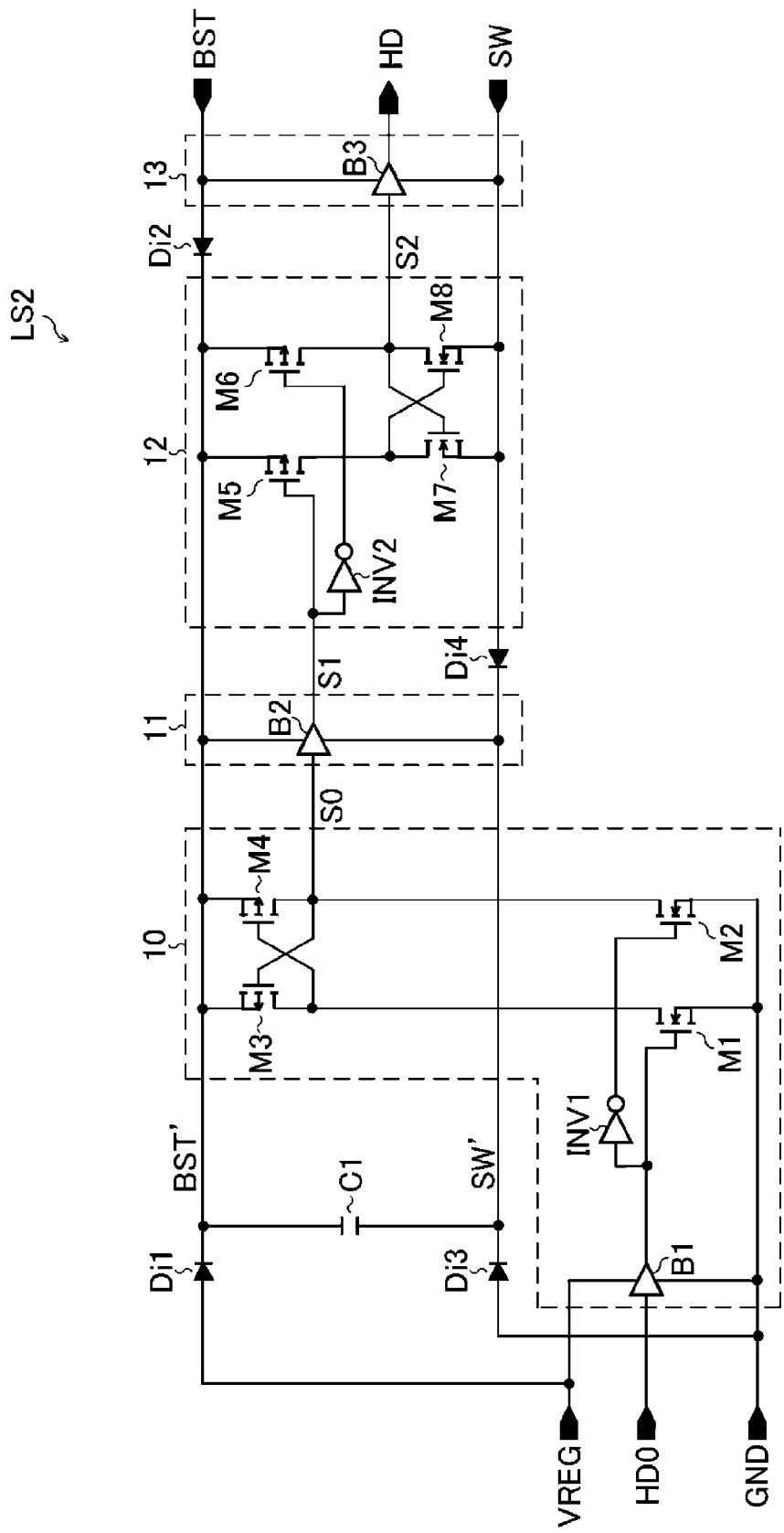
FIG. 7 is a view showing a specific example of the level shifter according to the embodiment.

FIG. 7 is a view showing a specific example of the level shifter LS2.

The front stage 10 of the level shifter LS2 shown in FIG. 7 includes a buffer B1, an inverter INV1, and a level shifter including N-channel MOS field effect transistors M1 and M2 and P-channel MOS field effect transistors M3 and M4.

A positive-side power supply voltage of the buffer B1 is the constant voltage VREG. A negative-side power supply voltage of the buffer B1 is the ground voltage GND.

A positive-side power supply voltage of the level shifter including the N-channel MOS field effect transistors M1 and M2 and the P-channel MOS field effect transistors M3 and M4 is a voltage BST'. A negative-side power supply voltage of the level shifter including the N-channel MOS field effect transistors M1 and M2 and the P-channel MOS field effect transistors M3 and M4 is the ground voltage GND.

The first signal generator 11 of the level shifter LS2 shown in FIG. 7 is a buffer B2.

A positive-side power supply voltage of the buffer B2 is the voltage BST'. A negative-side power supply voltage of the buffer B2 is a voltage SW'.

The second signal generator 12 of the level shifter LS2 shown in FIG. 7 includes the inverter INV2 and a down-shifter, which includes P-channel MOS field effect transistors M5 and M6 and N-channel MOS field effect transistors M7 and M8.

A positive-side power supply voltage of the down-shifter including the P-channel MOS field effect transistors M5 and M6 and the N-channel MOS field effect transistors M7 and M8 is the voltage BST'. A negative-side power supply voltage of the down-shifter including the P-channel MOS field effect transistors M5 and M6 and the N-channel MOS field effect transistors M7 and M8 is the switching voltage SW.

The third signal generator 13 of the level shifter LS2 shown in FIG. 7 is a buffer B3.

A positive-side power supply voltage of the buffer B3 is the bootstrap voltage BST. A negative-side power supply voltage of the buffer B3 is the switching voltage SW.

Diodes Di1 and Di2 of the level shifter LS2 shown in FIG. 7 are a specific example of the upper-side power supply 14.

The constant voltage VREG is applied to an anode of the diode Di1. The bootstrap voltage BST is applied to an anode of the diode Di2.

When the constant voltage VREG is higher than the bootstrap voltage BST, the voltage BST' applied to each cathode of the diodes Di1 and Di2 is a voltage dropped from the constant voltage VREG by a forward voltage of the diode Di1. On the other hand, when the bootstrap voltage BST is higher than the constant voltage VREG, the voltage BST' applied to each cathode of the diodes Di1 and Di2 is a voltage dropped from the bootstrap voltage BST by a forward voltage of the diode Di2.

Diodes Di3 and Di4 of the level shifter LS2 shown in FIG. 7 are a specific example of the lower-side power supply 15.

The ground voltage GND is applied to an anode of the diode Di3. The switching voltage SW is applied to an anode of the diode Di4.

When the ground voltage GND is higher than the switching voltage SW, the voltage SW' applied to each cathode of the diodes Di3 and Di4 is a voltage dropped from the ground voltage GND by a forward voltage of the diode Di3. On the other hand, when the switching voltage SW is higher than the ground voltage GND, the voltage SW' applied to each cathode of the diodes Di3 and Di4 is a voltage dropped from the switching voltage SW by a forward voltage of the diode Di4.

The level shifter LS2 shown in FIG. 7 further includes a capacitor C1. A first end of the capacitor C1 is connected to each cathode of the diodes Di1 and Di2. A second end of the capacitor C1 is connected to each cathode of the diodes Di3 and Di4.

Figure 8:
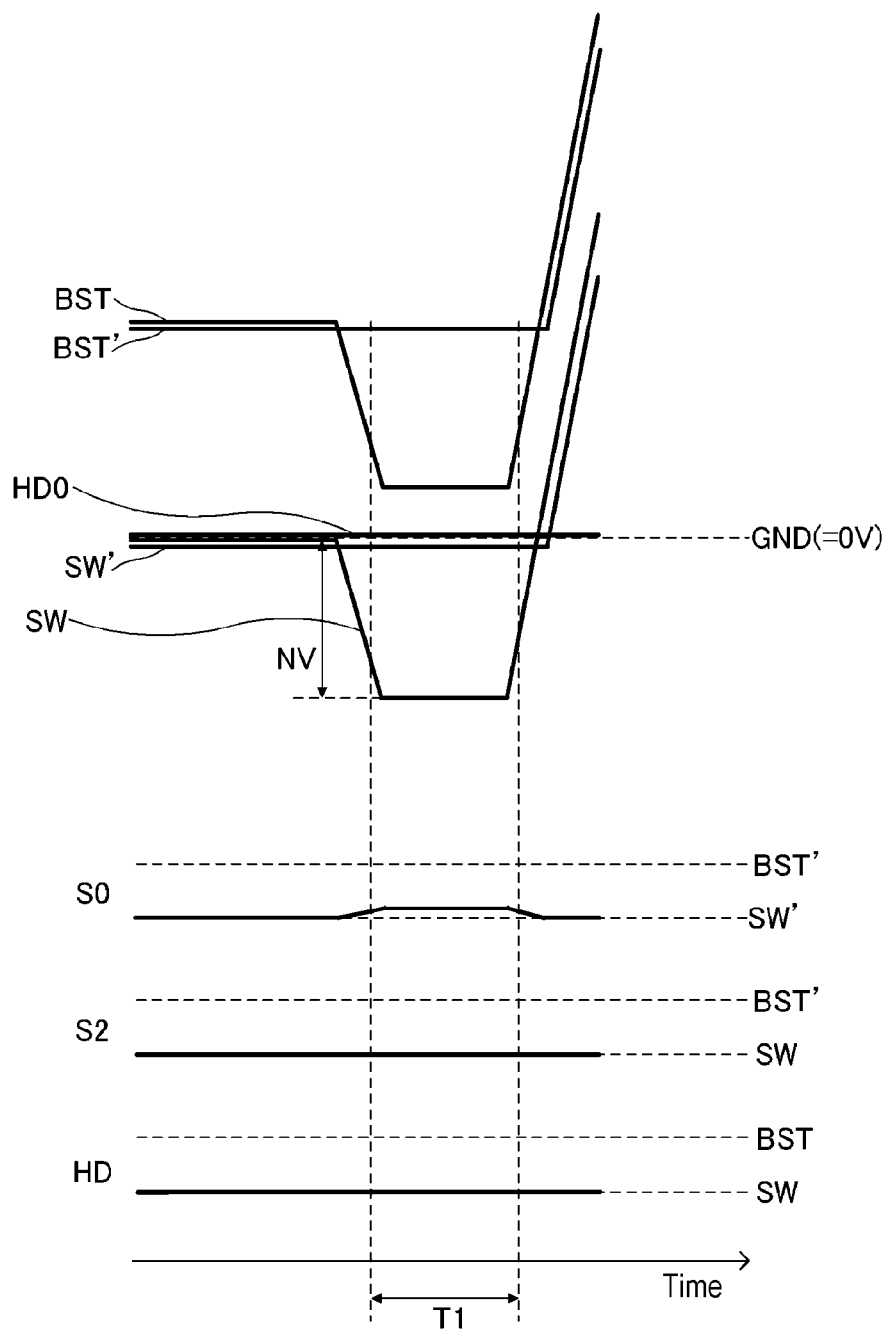
FIG. 8 is a timing chart showing voltages at various parts of the level shifter shown in FIG. 7.

FIG. 8 is a timing chart showing voltages at various parts of the level shifter LS2 shown in FIG. 7. In FIG. 8, the bootstrap voltage BST, the voltage BST', the control signal HD0, the voltage SW', the switching voltage SW, the intermediate signal S0, the second binary signal S2, and the control signal HD are depicted in order from the top.

During the period T1 in which the control signal HD0, which is 0 V, becomes closer to the bootstrap voltage BST than the switching voltage SW as the switching voltage SW significantly drops to the negative side, the intermediate signal S0 becomes closer to the voltage SW' than the voltage BST'. Therefore, in the period T1, the level shifter LS2 correctly determines that the control signal HD0, which is 0 V, is an input signal of a LOW level, and sets the control signal HD as an output signal of a LOW level.

<Application Example>

Figure 9:
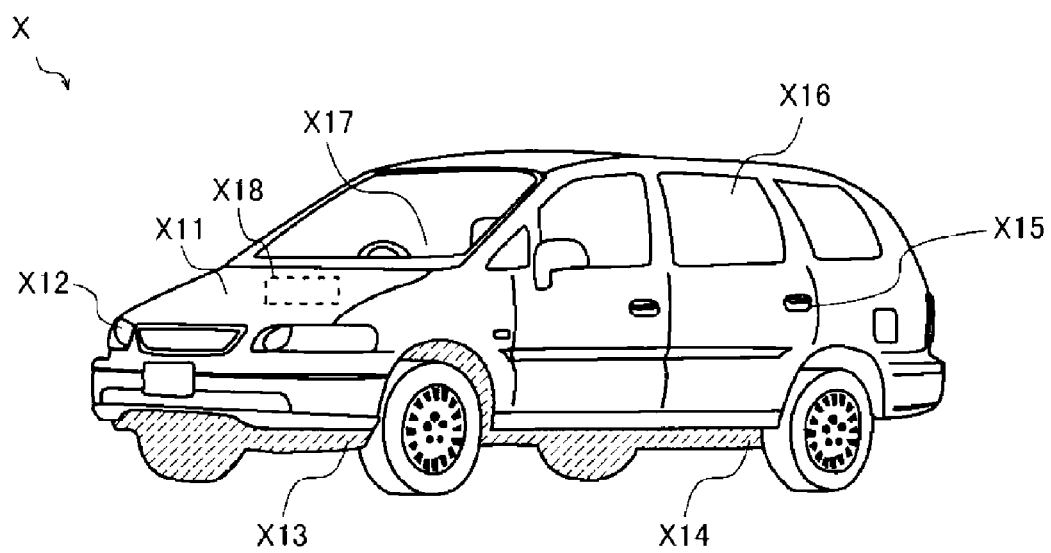
FIG. 9 is an external view of a vehicle.

FIG. 9 is an external view of a vehicle X. The vehicle X of this configuration example is equipped with various electronic devices X11 to X18 that operate by receiving a voltage output from a battery (not shown). Mounting positions of the electronic devices X11 to X18 in this figure may differ from actual positions for the sake of convenience of illustration.

The electronic device X11 is an engine control unit that performs engine-related controls (injection control, electronic throttle control, idling control, oxygen sensor heater control, auto cruise control, etc.).

The electronic device X12 is a lamp control unit that controls turning-on and turning-off of a high intensity discharged lamp (HID), a daytime running lamp (DRL), and the like.

The electronic device X13 is a transmission control unit that performs control related to a transmission.

The electronic device X14 is a braking unit that performs a control related to a movement of the vehicle X (ABS [anti-lock brake system] control, EPS [electric power steering] control, electronic suspension control, etc.).

The electronic device X15 is a security control unit that controls driving door locks, security alarms, and the like.

The electronic device X16 is an electronic device embedded in the vehicle X at the factory shipment stage as standard equipment parts or manufacturer option parts such as wipers, electric door mirrors, power windows, dampers (shock absorbers), electric sunroofs, electric seats, and the like.

The electronic device X17 is an electronic device that is optionally installed in the vehicle X as a user option such as an in-vehicle A/V [audio/visual] device, a car navigation system, an ETC [electronic toll collection system], or the like.

The electronic device X18 is an electronic device equipped with a high breakdown voltage motor such as an in-vehicle blower, an oil pump, a water pump, a battery cooling fan, or the like.

The switching power supply device 200 described above can be incorporated into any of the electronic devices X11 to X18. Further, application of the switching power supply device 200 described above is not limited to a power supply mounted on the vehicle X. The switching power supply device 200 may be used as, for example, a power supply mounted on industrial equipment.

<Others>

In addition to the above-described embodiment, the configuration of the present disclosure can be modified in various ways without departing from the spirit of the present disclosure. The above-described embodiment should be considered to be exemplary in all respects and not limitative. The technical scope of the present disclosure is defined by the claims rather than the above description of the embodiment. It should be understood that all changes falling within the meaning and range of equivalents of the claims are included in the technical scope of the present disclosure.

In the embodiments described above, the N-channel MOS field effect transistors Q1 and Q2 are GaN devices. However, the N-channel MOS field effect transistors Q1 and Q2 may be Si devices, for example. When the N-channel MOS field effect transistors Q1 and Q2 are Si devices, the drop of the switching voltage to the negative side during the dead time is small. However, when the constant voltage VREG is a low voltage such as 3 V, the level shifter may operate erroneously.

<Supplementary Notes>

Supplementary notes are provided for the present disclosure having specific configuration examples shown in the above-described embodiment.

A level shifter (LS2) of the present disclosure includes: a first signal generator (11) configured to generate a first binary signal in response to an input signal; a second signal generator (12) configured to generate a second binary signal in response to the first binary signal; and a third signal generator (13) configured to generate a third binary signal in response to the second binary signal, wherein the first signal generator and the second signal generator are further configured to use a first internal voltage, which is based on a first voltage, as an upper-side power supply voltage when the first voltage is higher than a second voltage, and use a second internal voltage, which is based on the second voltage, as the upper-side power supply voltage when the second voltage is higher than the first voltage, wherein the third signal generator is further configured to use the second voltage as an upper-side power supply voltage, wherein the first signal generator is further configured to use a third internal voltage, which is based on a third voltage, as a lower-side power supply voltage when the third voltage is higher than a fourth voltage, and use a fourth internal voltage, which is based on the fourth voltage, as the lower-side power supply voltage when the fourth voltage is higher than the third voltage, wherein the second signal generator and the third signal generator are further configured to use the fourth voltage as the lower-side power supply voltage, and wherein the third voltage is lower than the first voltage and the fourth voltage is lower than the second voltage (first configuration).

The level shifter of the first configuration may further include an upper-side power supply (14) configured to generate the first internal voltage and the second internal voltage (second configuration).

In the level shifter of the second configuration, the upper-side power supply may include a first diode (Di1) having an anode to which the first voltage is applied, and a second diode (Di2) having an anode to which the second voltage is applied, and each cathode of the first diode and the second diode may be connected to the first signal generator and the second signal generator (third configuration).

The level shifter of any one of the first to third configurations may further include a lower-side power supply (15) configured to generate the third internal voltage and the fourth internal voltage (fourth configuration).

In the level shifter of the fourth configuration, the lower-side power supply may include a third diode (Di3) having an anode to which the third voltage is applied, and a fourth diode (Di4) having an anode to which the fourth voltage is applied, and each cathode of the third diode and the fourth diode may be connected to the first signal generator (fifth configuration).

A drive circuit (DRV2) of the present disclosure includes the level shifter of any one of the first to fifth configurations, wherein the drive circuit is configured to drive switching elements (Q1 and Q2) (sixth configuration).

A switching power supply device of the present disclosure includes: the drive circuit of the sixth configuration; a first switching element and a second switching element as the switching elements; and a bootstrap circuit (BST1) configured to generate the second voltage from the fourth voltage generated at a connection node between the first switching element and the second switching element (seventh configuration).

In the switching power supply device of the seventh configuration, each of the first switching element and the second switching element may be a GaN device (eighth configuration).

A vehicle (X) of the present disclosure includes the switching power supply device of the seventh or eighth configuration (ninth configuration).

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A level shifter, comprising:
a first signal generator configured to generate a first binary signal in response to an input signal;
a second signal generator configured to generate a second binary signal in response to the first binary signal;
a third signal generator configured to generate a third binary signal in response to the second binary signal,
wherein the first signal generator and the second signal generator are further configured to use a first internal voltage, which is based on a first voltage, as an upper-side power supply voltage when the first voltage is higher than a second voltage, and use a second internal voltage, which is based on the second voltage, as the upper-side power supply voltage when the second voltage is higher than the first voltage,
wherein the third signal generator is further configured to use the second voltage as an upper-side power supply voltage,
wherein the first signal generator is further configured to use a third internal voltage, which is based on a third voltage, as a lower-side power supply voltage when the third voltage is higher than a fourth voltage, and use a fourth internal voltage, which is based on the fourth voltage, as the lower-side power supply voltage when the fourth voltage is higher than the third voltage,
wherein the second signal generator and the third signal generator are further configured to use the fourth voltage as the lower-side power supply voltage, and
wherein the third voltage is lower than the first voltage and the fourth voltage is lower than the second voltage; and
a lower-side power supply configured to generate the third internal voltage and the fourth internal voltage,
wherein the lower-side power supply includes a third diode having an anode to which the third voltage is applied, and a fourth diode having an anode to which the fourth voltage is applied, and
wherein each cathode of the third diode and the fourth diode is connected to the first signal generator.

2. The level shifter of claim 1, further comprising an upper-side power supply configured to generate the first internal voltage and the second internal voltage.

3. The level shifter of claim 2, wherein the upper-side power supply includes a first diode having an anode to which the first voltage is applied, and a second diode having an anode to which the second voltage is applied, and
wherein each cathode of the first diode and the second diode is connected to the first signal generator and the second signal generator.

4. A drive circuit, comprising the level shifter of claim 1, wherein the drive circuit is configured to drive switching elements.

5. A switching power supply device, comprising:
the drive circuit of claim 4;
a first switching element and a second switching element as the switching elements; and
a bootstrap circuit configured to generate the second voltage from the fourth voltage generated at a connection node between the first switching element and the second switching element.

6. The switching power supply device of claim 5, wherein each of the first switching element and the second switching element is a GaN device.

7. A vehicle, comprising the switching power supply device of claim 5.

* * * * *